(12) United States Patent
Zhang et al.

(10) Patent No.: US 9,716,057 B1
(45) Date of Patent: Jul. 25, 2017

(54) OFFSET LEADFRAME CASCODE PACKAGE

(71) Applicant: United Silicon Carbide, Inc., Monmouth Junction, NJ (US)

(72) Inventors: Hao Zhang, Plainsboro, NJ (US); Anup Bhalla, Princeton Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/245,382

(22) Filed: Aug. 24, 2016

(51) Int. Cl.
| | |
|---|---|
| H01L 23/495 | (2006.01) |
| H01L 25/18 | (2006.01) |
| H01L 23/31 | (2006.01) |
| H01L 23/367 | (2006.01) |
| H01L 23/02 | (2006.01) |
| H01L 23/00 | (2006.01) |

(52) U.S. Cl.
CPC ........ *H01L 23/49562* (2013.01); *H01L 23/02* (2013.01); *H01L 23/3107* (2013.01); *H01L 23/3675* (2013.01); *H01L 23/49537* (2013.01); *H01L 23/49575* (2013.01); *H01L 24/48* (2013.01); *H01L 24/85* (2013.01); *H01L 25/18* (2013.01); *H01L 2224/48247* (2013.01); *H01L 2224/85205* (2013.01); *H01L 2924/13062* (2013.01); *H01L 2924/13091* (2013.01)

(58) Field of Classification Search
CPC ................................. H01L 23/49524
See application file for complete search history.

(56) References Cited

U.S. PATENT DOCUMENTS

2007/0284720 A1* 12/2007 Otremba ........... H01L 23/49524
257/690

* cited by examiner

*Primary Examiner* — Samuel Gebremariam
(74) *Attorney, Agent, or Firm* — Baker & Hostetler LLP (57) ABSTRACT

A composite semiconductor device, such as a high-voltage cascode, is constructed in a single package by mounting a first die on a first planar substrate and second die mounted on a second planar substrate, where the substrates are separated by a gap filled with a dielectric encapsulant. The substrates may be separated both vertically and as well as laterally, to lie in different parallel planes. The substrates are in a leadframe that also includes interconnections, heat sinks, package pins, and removable tie-bars, forming a contiguous metallic structure. Multi-device frames containing multiple leadframes joined by additional tie-bars may be used to process multiple composite semiconductor devices together in, e.g., step-and-repeat wire and die bonding processes and batch encapsulation molding batch processes.

5 Claims, 6 Drawing Sheets

OFFSET LEADFRAME CASCODE PACKAGE

FIELD OF THE DISCLOSURE

Transistors made from silicon carbide are useful in power electronic circuits, such as power factor correction (PFC) circuits, DC-DC converters, DC-AC inverters, and motor drives.

SUMMARY

A composite semiconductor device, such as a high-voltage cascode, may be constructed in a single package by mounting a first die on a first planar substrate and second die mounted on a second planar substrate, where the first and second substrate are separated by a gap filled with a dielectric encapsulant. In the case of a cascode, the dies may be a high-voltage JFET and a low-voltage MOSFET, for example. To achieve greater isolation, the gap may be created by spacing the substrates vertically as well as laterally, such that the substrates lie in different parallel planes. Construction may be facilitated by the use of a leadframe that includes various regions, e.g., the substrates on different planes, interconnections, heat sinks, package pins, etc., as well as removable tie-bars that hold the lead frame regions together at various stages of assembly. The leadframe may be metallic, such that the regions and the tie-bars together form a contiguous metallic structure. Leadframes may be arranged, for instance, to form devices in standard package formats, such as TO-220 or TO-247 packages. Multi-device frames may be used that include multiple leadframes joined together by additional removable tie-bars. A multi-device frame may be used in, e.g., step-and-repeat processes, whereby the multi-device frame is advanced to a first leadframe, an operation such as die bonding or wire bonding is performed, the multi-device frame is advanced, and the operation is repeated. Multiple work stations may operate in conjunction on a single multi-device frame, such that different operations are performed on different leadframes at the same time. Operations on substrates lying in different planes may be achieved through the use of supports of different heights for a single leadframe within a workstation, e.g., via a vacuum chuck jig with multiple surface heights. Encapsulation may be performed while devices are joined within a multi-device frame, separated into single leadframes, or partially separated.

This summary is provided to introduce a selection of concepts in a simplified form that are further described below in the detailed description. This summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale.

DETAILED DESCRIPTION

A composite semiconductor device, such as a high-voltage cascode, may be constructed in a single package by mounting a first die on a first planar substrate and second die mounted on a second planar substrate, where the first and second substrate are separated by a gap filled with a dielectric encapsulant. In the case of a cascode, the dies may be a high-voltage JFET and a low-voltage MOSFET, for example. To achieve greater isolation, the gap may be created by spacing the substrates vertically as well as laterally, such that the substrates lie in different parallel planes. Construction may be facilitated by the use of a leadframe that includes various regions, e.g., the substrates on different planes, interconnections, heat sinks, package pins, etc., as well as removable tie-bars that hold the lead frame regions together at various stages of assembly. The leadframe may be metallic, such that the regions and the tie-bars together form a contiguous metallic structure. Leadframes may be arranged, for instance, to form devices in standard package formats, such as TO-220 or TO-247 packages. Multi-device frames may be used that include multiple leadframes joined together by additional removable tie-bars. A multi-device frame may be used in, e.g., step-and-repeat processes, whereby the multi-device frame is advanced to a first leadframe, an operation such as die bonding or wire bonding is performed, the multi-device frame is advanced, and the operation is repeated. Multiple work stations may operate in conjunction on a single multi-device frame, such that different operations are performed on different leadframes at the same time. Operations on substrates lying in different planes may be achieved through the use of supports of different heights for a single leadframe within a workstation, e.g., via a vacuum chuck jig with multiple surface heights. Encapsulation may be performed while devices are joined within a multi-device frame, separated into single leadframes, or partially separated.

One advantage of using a single leadframe with multiple isolated chip bonding substrates is the ability to attach multiple dies in parallel. Another is avoidance of the requirement for an additional component to provide isolation, such as a bonded copper ceramic isolators.

Figure 1:
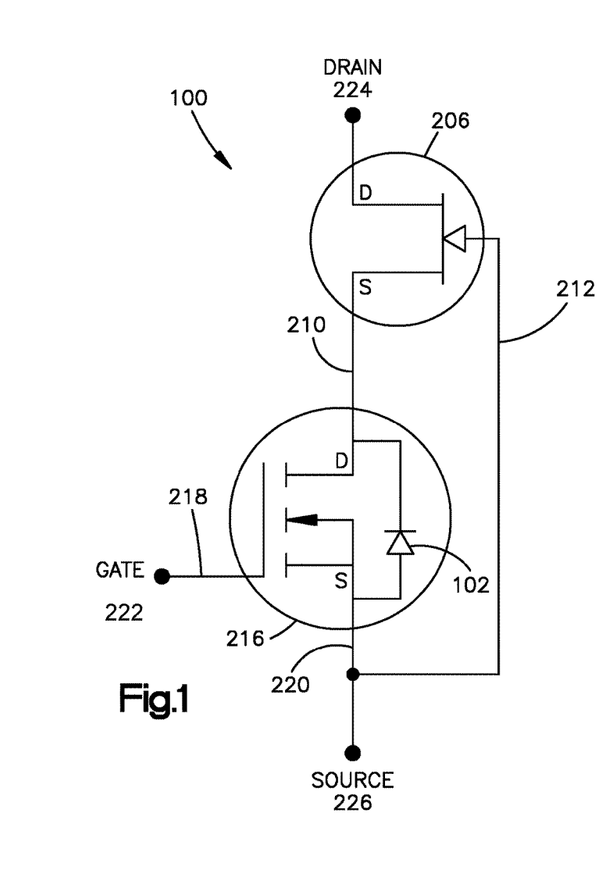
FIG. 1 is a schematic of an example cascode circuit.

FIG. 1 is a schematic of an example cascode circuit 100. Cascode operation offers many advantages for fast switching power devices. The cascode is formed by the series connection of two transistors. These may each be high-voltage or low-voltage, n-type or p-type and normally-on or normally-off devices, for example. For present purposes, the term "low-voltage" means a device standing voltage rating of 100 V or less, and "high-voltage" refers to a device standing voltage rating higher than 100 V. For example, a low-voltage device may only see a maximum voltage of 20 to 40 V in operation, whereas a high-voltage device may see 600 to 1700 V or more. Similarly, cascode circuits may be made using transistors of widely varying types, thresholds, and voltage ratings.

FIG. 1 is a schematic diagram of the circuit of an example device 100. Device 100 has two n-type transistors. MOSFET 216 is a low-voltage, normally-off device made out of silicon. MOSFET 216 has a voltage rating of 30 and a threshold of 5 V. MOSFET 216 is controlled with a 0 to 10 V gate control voltage. MOSFET 216 includes an intrinsic diode 102. JFET 206 is a high-voltage, normally-on device made out of silicon carbide. JFET 206 has a voltage rating of 1.2 kV.

The source of JFET 206 is connected to the drain of MOSFET 216 via a connector 210. The gate of JFET 206 is connected to the source of the device 226 via a connector 212, and to the source of the MOSFET 216 via a connector 220, thus forming a normally-off cascode. The composite device, with a drain 224 (which is the drain of the JFET 206), gate 222, and source 226, behaves as a normally-off switch. Device 100 may be controlled by a low-voltage MOSFET gate drive, not shown. In operation, a gate drive of 0 or 10 V is applied to the cascode gate 222, which is fed to the gate of MOSFET 216 via a gate connector 218. Activation of the MOSFET 216 is achieved by presenting the higher gate voltage of 10 V, which enables conduction through JFET 206.

Figure 2:
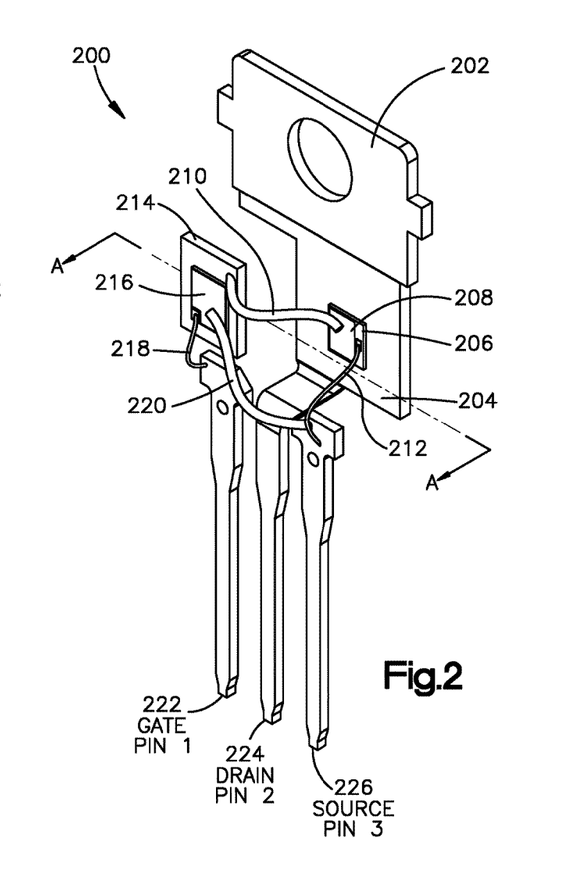
FIG. 2 is a perspective view of the metal and semiconductor components of an example packaged cascode.

FIG. 2 is a perspective view of an example unencapsulated cascode assembly 200. Cascode 200 is constructed according to the schematic of FIG. 1. The components are arranged on a lead frame in preparation for encapsulation to form a TO package such, as a TO-220, TO-247, or the like. This three-terminal configuration of the cascode, after transfer molding, produces a device that is externally similar to a conventional three-terminal MOSFET.

FIG. 2 does not show the encapsulation which completes the packaging. The components are shown as they would be after separation from an assembly leadframe, e.g., after a punching operation that separates two of the pins and bonding pads from the leadframe. Gate pin 222, drain pin 224, and source pin 226 correspond to pins 1, 2, and 3, respectively, of a standard TO-220 semiconductor package.

Heat sink tab 202, JFET bond pad 204, and cascode drain pin 224 are different sections of one contiguous metal piece. The JFET die 206 has a backside drain connection bonded directly to the JFET bond pad 204. JFET 206 has a top side source pad 208 which is connected to the MOSFET bond pad 214 via connector 210. JFET 206 also has a small topside gate bond pad which is connected via connector 212 to the cascode source pin 226. The MOSFET die 216 has a backside drain connection bonded directly to the MOSFET bond pad 214. MOSFET 216 also has a large topside source bonding pad which is connected to the cascode source pin 226 via connector 220. MOSFET 216 further has a topside gate pad connected to the cascode gate pin 222 via connector 218. A gap between JFET bond pad 204 and MOSFET bond pad 214 provides isolation, such that the JFET 206 may be operated at high voltages while the MOSFET 216 is operated at low voltages, without the need for a separate component to isolate the JFET 206 from the MOSFET 204. In practice, that gap is normally filled with an encapsulant, not shown in FIG. 2.

Figure 3A:
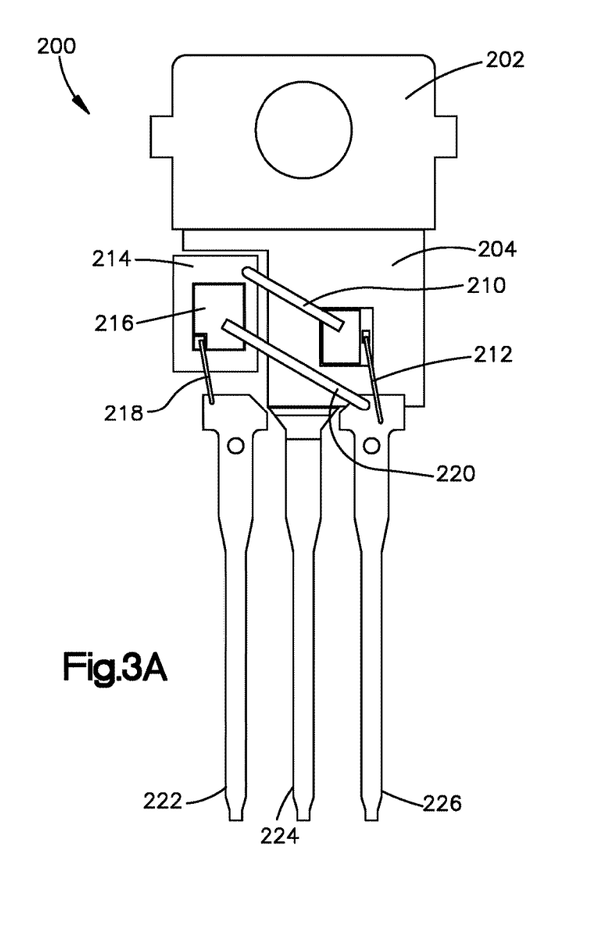
FIGS. 3A and 3B are front and side views, respectively, of the example packaged cascode of FIG. 2.
Figure 3B:
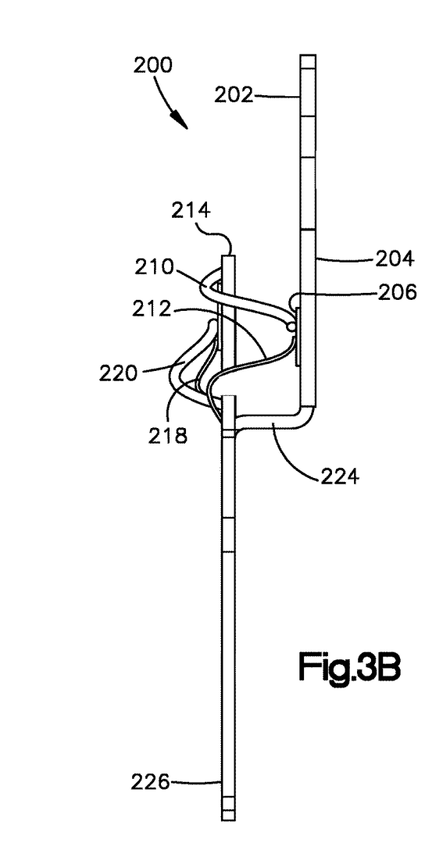

FIGS. 3A and 3B are front and side views, respectively, of the example cascode 200 of FIG. 2. The offset of the JFET bond pad 204 and MOSFET bond pad 214 provides a gap which allows the high-voltage and low-voltage dies to be physically isolated to avoid arcing. This allows the MOSFET 216 to be isolated even when the high-voltage JFET die pad 204 is exposed out of the back of the package for better thermal performance. Further, the offset allows the isolation to be achieved without the use of, e.g., an expensive direct-bond-copper (DBC) substrate for the MOSFET 216. In FIG. 3A, a small lateral gap is seen between JFET bond pad 204 and MOSFET bond pad 214, where the MOSFET pad 214 is down and to the left from the JFET pad 204. In FIG. 3B, a large vertical gap is seen between JFET bond pad 204 and MOSFET bond pad 214. In this example, MOSFET bond pad 204 lies in the plane of the pins, e.g., pin 226, rather than on the plane of the heat sink tab 202.

Figure 4:
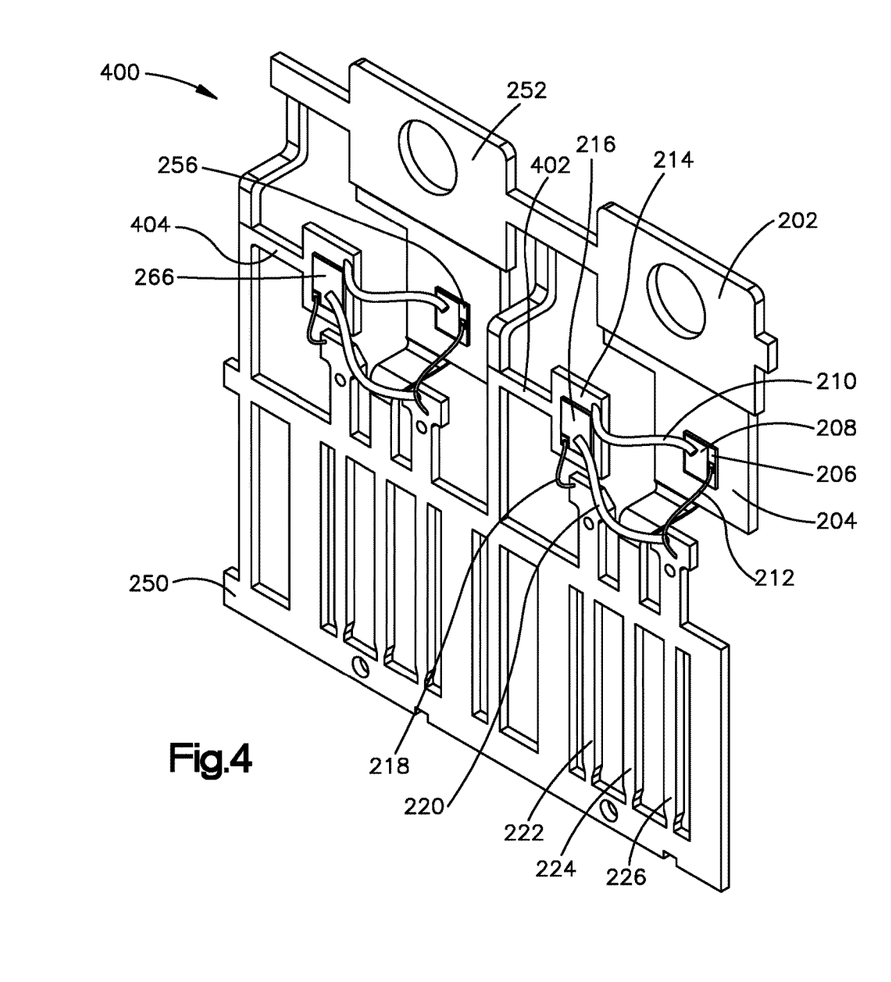
FIG. 4 is a perspective view of an example leadframe bearing two cascode assemblies in process of manufacture.

FIG. 4 is a perspective view of an example leadframe 400 bearing two cascode assemblies in process of manufacture. Here the components of the cascode device 200 of FIGS. 2, 3A, and 3B are shown on the right. On the left is a second cascode device. In practice, the leadframe may be extended to the left or right to support any number of cascode assemblies being manufactured together in step-and-repeat die bonding and wire-bonding processes, for example. Leadframes with 10 to 50 cascode units or more in a single strip may be used to improve manufacturing throughput efficiency, for instance. The gaps between the bond pads are seen to be both lateral and vertical.

FIG. 4 shows the two cascode devices in process of manufacture on an example leadframe 400. Leadframe 400 is shown before the elements are separated, e.g., by stamping or laser cutting, and encapsulated, e.g., by transfer molding. JFETs 206 and 256, MOSFETS 216 and 266, and connectors such as connectors 212, 218, and 220 are all bonded with at least one connection to bulk 250 of the leadframe 400. Bulk 250 may be a single, contiguous metallic component, for example. The bonding pads of the MOSFETS 216 and 266 are suspended in their isolated positions by bridge elements 402 and 404, respectively. These bridge elements 402 and 404 will eventually be cut away to finish the separate cascode assemblies, e.g., either before or after encapsulation. Similarly, other parts of the bulk 250 will be cut away to separate the pins, such as gate, drain, and source pins 222, 224, and 226 respectively, and the heat sink tabs 202 and 252, leaving two cascode assemblies as depicted in FIGS. 2, 3A, and 3B.

The bulk 250 of leadframe 400 may be made by stamping or molding to form a contiguous metal frame. The leadframe 400 may then be completed by bonding the dies to the bond pad areas of bulk 250, and next adding wire-bonded connectors, for example.

In the examples of FIGS. 2, 3A, and 4, the MOSFET bond pad 214 is on a different plane than the JFET bond pad 204. Alternatively, the bond pads may be separated laterally only, and lie in the same plane. In the case that they are on different planes, a jig may be used to provide extra support to either or both bonding pads. This may be done, for example, to facilitate ultrasonic bonding of the dies to the bonding pads, to facilitate ultrasonic wire bonding of connectors to the dies, or both. The jig may be as simple as two surfaces to support two bonding pads at different heights. Alternatively, the jib may extend the length of the entire leadframe 400, and advance with the leadframe through a step-and-repeat process in which various components are added to the leadframe assembly.

Figure 5:
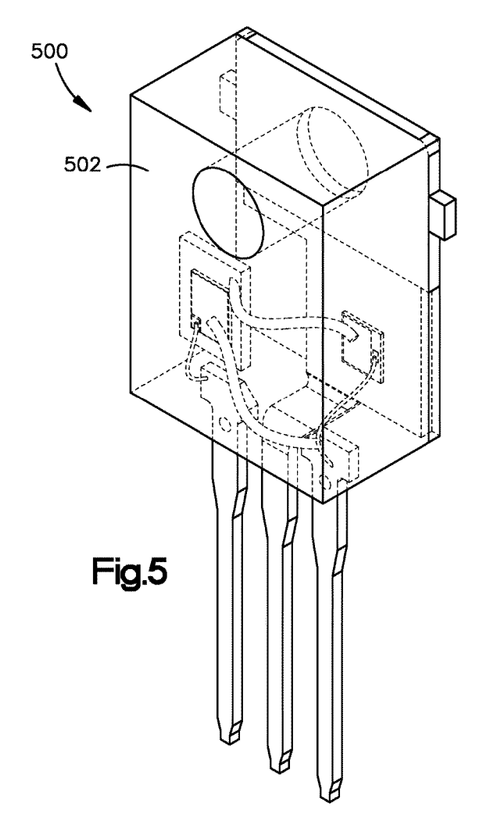
FIG. 5 is a perspective drawing of the example cascode of FIG. 2, shown after the addition of encapsulant material.

FIG. 5 is a perspective drawing of the example cascode assembly 500.

Cascode assembly 500 includes the components of device 200 as described in reference to FIGS. 2, 3A, and 3B. Cascode assembly 500 further includes an encapsulant 502 that serves several purposes. Encapsulant 502: holds the components in place relative to one another; protects the components; defines exterior dimensions; and provides a high level of isolation in the gap between the dies. Encapsulant 502 may be a thermoplastic, for example, that is molded around the other components. Encapsulant 502 may be chosen to have a high dielectric strength, and thereby provide high voltage isolation, e.g., in the gap between the MOSFET drain and the high-voltage JFET drain.

The encapsulant may have a dielectric strength that is higher than that of air, such that the gap between the bonded MOSFET and bonded JFET may be smaller than if the surrounding medium were air. For instance, an isolation of 2.5 KV may be achieved with a gap of just 0.4 mm that is filled with available mold compounds. This is more than sufficient to achieve a rated operating level up to 1700 V. Gaps for high-voltage devices will generally be in the range of 1 to 10 mm, with gaps of 1 to 5 mm for devices with 10 kV isolation requirements and 5 to 10 mm for devices with 20 kV isolation requirements, for example. The exact gap size used may depend, for instance, on the dielectric strength of the encapsulant or specific regulatory requirements.

The exact amount of clearance required is dictated by the creepage and clearance requirements between the connections to the MOSFET die pad, for example, and the conductors of the finished device and system that are at the JFET drain potential. The distance is chosen such that the provided isolation exceeds, for example, that provided by the minimum spacing seen between the drain and source leads in air. The exact dimensions, therefore, may be adapted as needed for ease of die attach, wire bond, molding and trimming, given the voltage rating requirements of the device.

Figure 6:
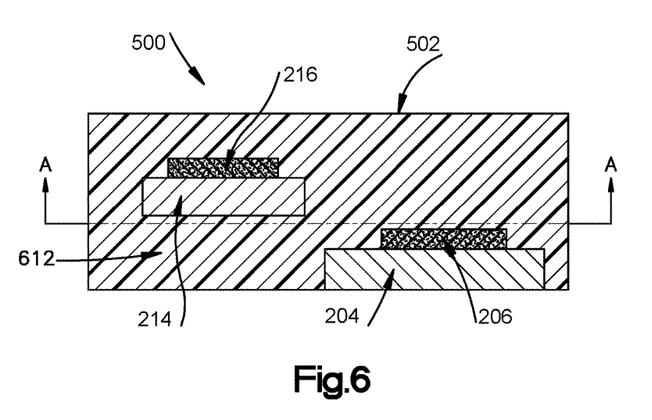
FIG. 6 is a cross section of the example cascode of FIGS. 2 and 5, shown after encapsulation along section AA of FIG. 2.

FIG. 6 is a cross section of an example cascode 500 that is made using the components depicted in FIGS. 2, 3A, 3B, and 5. FIG. 6 is shown after encapsulation, and taken along section line AA of FIG. 2. The MOSFET die 216 is bonded to the MOSFET bonding pad 214. The JFET die 206 is bonded to the JFET bonding pad 204. The encapsulant 502 surrounds the bonded MOSFET die 216 and its pad 214, and covers the top of the JFET die 206. In this example, the encapsulant 612 completely fills the gap between the MOSFET bond pad 214 and JFET bond pad 204. However, while the encapsulant 502 defines most of the surface of cascode 500, it does not cover the back of the JFET bond pad 204. Bond pad 204 is exposed to better heat removal, as in conventional, e.g., in MOSFET packages. This is in contrast to region 612 behind the MOSFET bonding pad 214. Region 612 is filled with encapsulant material 502, insulating the bonding page 214 from the exterior surface of cascode 500.

Figure 7:
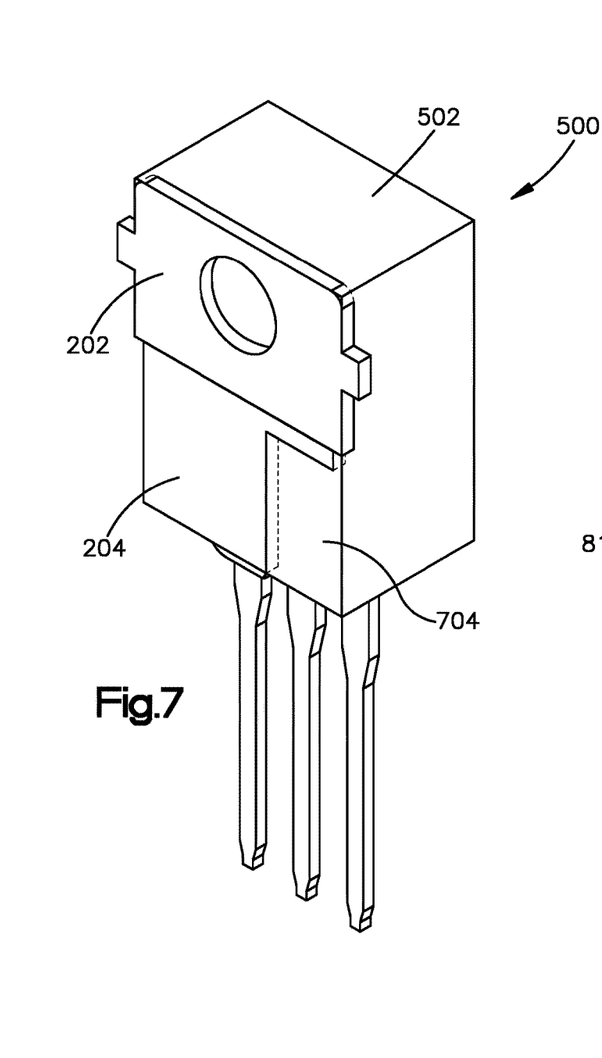
FIG. 7 is a rear perspective view of the example cascode of FIG. 5.

The configuration of FIG. 6 is also seen in FIG. 7. FIG. 7 is a rear perspective view of the example cascode 500 of FIG. 5. JFET bond pad 204 is exposed on a portion of the back of the device, as is heat sink 202. In this example, the sides and front face (not shown) of the cascode 500 are made of the encapsulant material 502. A portion of the back surface 704 is also made of encapsulant material 502. This corresponds to the region beneath the MOSFET die pad 214 in the examples of FIGS. 2, 3A, and 3B, for example.

Figure 8:
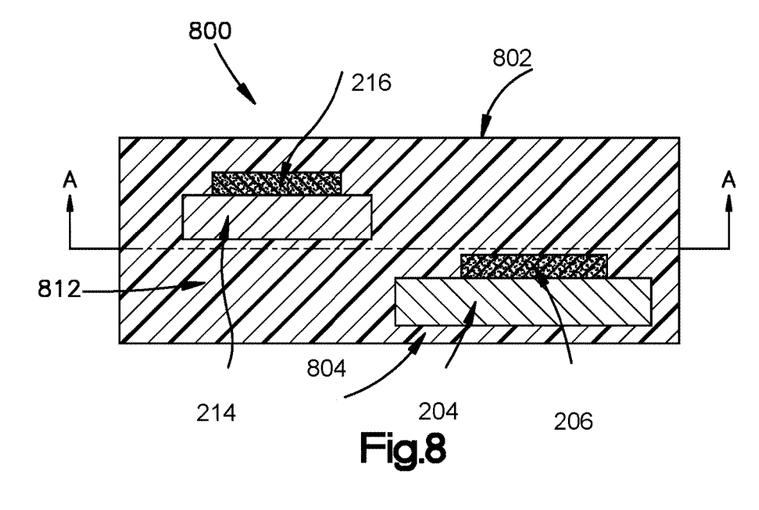
FIG. 8 is a cross section of an alternative example cascode assembly, shown after encapsulation along section AA of FIG. 2.

FIG. 8 is a cross section of an alternative example cascode assembly 800, which also uses the components of FIGS. 2, 3A, and 3B. In FIG. 8, cascode 800 is shown after encapsulation along section AA of FIG. 2. Cascode 800 is similar to cascode 500 as depicted in FIGS. 6 and 7. However, here in FIG. 8 the JFET bonding pad 204 is not exposed at the rear of assembly 800. The encapsulant 802 surrounds the MOSFET 216 and its bonding pad 214, as well as the JFET 206 and its bonding pad 204. Again in this example, the encapsulant 612 completely fills the gap between the MOSFET bond pad 214 and JFET bond pad 204. In addition to the region 812 of encapsulant behind the MOSFET bonding pad 214, there is an analogous region 804 behind the JFET bonding pad 804. This configuration allows, for example, many cascode devices with different drain potentials to be mounted on common heatsink. In this configuration, the MOSFET and JFET die pads may be on the same internal plane, i.e., merely offset laterally, or be placed at different offsets from the rear surface of the device. The dielectric constant and thickness of encapsulant 802 set the actual isolation of the high-voltage device.

Figure 9:
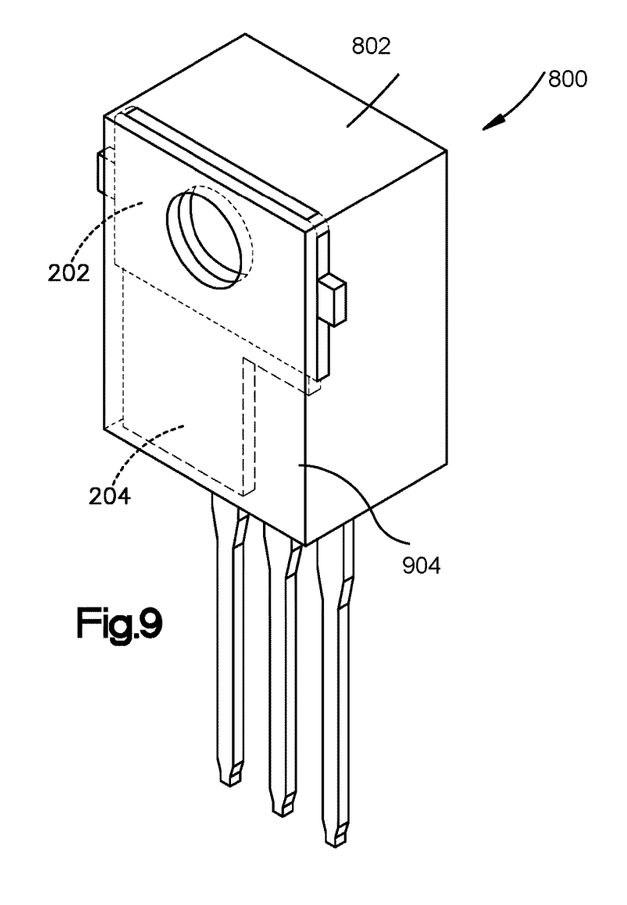
FIG. 9 is a rear perspective view of the example cascode of FIG. 8.

FIG. 9 is a rear perspective view of the example cascode 800 of FIG. 8. Here, JFET bonding pad 204 is not exposed on the back surface 904 of the cascode 800. Nor is the heat sink 202. In some embodiments, heatsink 202 may be even with, or protrude from, the sides of cascode 800. However, generally in embodiments where the heatsink 202 does not protrude from the back for thermal bonding, it is better that it not be even with or protrude from the sides in order to prevent arcing to an external heatsink.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A packaged cascode, comprising:
   a) a junction field effect transistor die mounted on a first planar substrate;
   b) a metal oxide semiconductor field effect transistor die mounted on a second planar substrate, the second substrate being separated from the first substrate by a vertical gap, wherein the first planar substrate and the second planar substrate lie in separate parallel planes; and
   c) a dielectric encapsulant, the dielectric encapsulant enclosing at least a portion of each of the junction field effect transistor die, the metal oxide semiconductor field effect transistor die, the first planar substrate, and the second planar substrate, wherein the dielectric encapsulant fills the vertical gap separating the first and second substrates;
   d) wherein the junction field effect transistor die and the metal oxide semiconductor field effect transistor die are electrically interconnected to form a cascode, and
   e) wherein the second planar substrate is to the side of the first planar substrate, such that the first and second planar substrates do not overlap laterally.

2. The packaged cascode of claim 1, wherein the vertical gap is in the range of 1 to 10 mm.

3. The packaged cascode of claim 2, wherein the packaged cascode is in the form of a TO-220 or TO-247 packaged device.

4. The packaged cascode of claim 3, further comprising an exposed heat sink tab.

5. The packaged cascode of claim 1, wherein the vertical gap is in the range of 1 to 5 mm.

\* \* \* \* \*